(12) United States Patent
Malone et al.

(10) Patent No.: US 6,927,976 B1
(45) Date of Patent: Aug. 9, 2005

(54) AIR BAFFLE FOR MANAGING COOLING AIR RE-CIRCULATION IN AN ELECTRONIC SYSTEM

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 14 days.

(21) Appl. No.: 10/759,846

(22) Filed: Jan. 15, 2004

(51) Int. Cl.[7] ............................................. H05K 7/20
(52) U.S. Cl. ........................ 361/690; 361/687; 361/688; 361/695; 454/184
(58) Field of Search .............................. 361/687–695, 361/715, 716, 721, 726, 727; 174/16.1, 252; 165/104.33, 122; 454/184

(56) References Cited

U.S. PATENT DOCUMENTS

| | | | |
|---|---|---|---|
| 4,894,749 A | 1/1990 | Elko et al. | |
| 5,136,465 A | 8/1992 | Benck et al. | |
| 5,321,581 A | 6/1994 | Bartilson et al. | |
| 5,398,159 A * | 3/1995 | Andersson et al. | 361/695 |
| 5,410,448 A | 4/1995 | Barker, III et al. | |
| 5,914,858 A | 6/1999 | McKeen et al. | |
| 5,923,531 A | 7/1999 | Bachman et al. | |
| 6,222,729 B1 | 4/2001 | Yoshikawa | |
| 6,288,898 B1 | 9/2001 | Johnson et al. | |
| 6,353,536 B1 * | 3/2002 | Nakamura et al. | 361/686 |
| 6,400,567 B1 | 6/2002 | McKeen et al. | |
| 6,480,381 B2 * | 11/2002 | Negishi | 361/695 |
| 6,524,126 B1 | 2/2003 | Kurimski et al. | |
| 6,563,704 B2 * | 5/2003 | Grouell et al. | 361/687 |
| 6,704,198 B2 * | 3/2004 | Replogle et al. | 361/690 |
| 6,775,137 B2 * | 8/2004 | Chu et al. | 361/696 |

\* cited by examiner

Primary Examiner—Boris Chervinsky

(57) ABSTRACT

An airflow management apparatus is used in an electronic system and includes a flexible air baffle that mounts on a chassis of an electronic device in an arrangement and obstructs air flow between an air inlet vent and an air exhaust vent of the electronic device. The flexible air baffle has a thickness that extends across a gap to contact an adjacent vertically-stacked electronic device.

22 Claims, 9 Drawing Sheets

AIR BAFFLE FOR MANAGING COOLING AIR RE-CIRCULATION IN AN ELECTRONIC SYSTEM

BACKGROUND OF THE INVENTION

Electronic systems and equipment such as computer systems, network interfaces, storage systems, and telecommunications equipment are commonly enclosed within a cabinet or housing for support, physical security, and efficient usage of space. Electronic equipment contained within the enclosure generates a significant amount of heat. Thermal damage may occur to the electronic equipment unless the heat is removed.

Low-profile computer system installations present significant thermal management difficulties. For example, Electronics Industry Association (EIA) standard racks are commonly used to house electronic equipment. In relatively large systems, for example 2U or larger where "U" is the measuring unit for racks and rack-mountable components with 1U=1.75" or 44.45 mm, most cooling air enters through the front of the enclosure and exits through the rear. For low-profile systems, the enclosure front is significantly blocked by hard drives and media devices. The rear is blocked by power supplies and input/output (I/O) connectors. To lower air flow resistance through the enclosure and enhance cooling, typical 1U and 2U servers use a perforation on the top of the enclosure to supply cooling air and to vent heated exhaust. In a rack fully loaded with standard electronic equipment 1U and 2U devices, such as servers, computers, I/O equipment, and the like, a small clearance is interposed between adjacent stacked devices. For example, in some systems approximately 0.050 inches of clearance separates the devices. The small space between systems permits fresh air from the room to enter near the front of the enclosure and warmed air to exhaust near the rear through separate perforation patterns in the enclosure. However, an unimpeded and direct airflow path exists between the enclosure inlet and exit allowing hot exhaust air to re-circulate from the devices to the inlet vent, a problem that is exacerbated by cable blockage of airflow exiting the rear of the enclosure. Re-circulation of heated air can create thermal difficulties that may result in system overheating and failure.

Re-circulation of heated air can impact performance of electronic equipment. If airflow patterns allow re-usage of air that is previously heated by electronic equipment, attempts to cool electronic equipment can fail and less effective heat transfer from the equipment to the cooling airflow can result. In some circumstances insufficient heat transfer can take place and the equipment may overheat and potentially sustain thermal damage.

SUMMARY

What are desired are an apparatus and operating method that reduce or eliminate re-circulation of heated exhaust air from an electronic device.

In accordance with various embodiments of an airflow management apparatus for usage in an electronic system, a flexible air baffle mounts on a chassis of an electronic device in an arrangement that obstructs air flow between an air inlet vent and an air exhaust vent of the electronic device. The flexible air baffle has a thickness that extends across a gap to contact an adjacent vertically-stacked electronic device.

According to other embodiments, an electronic device comprises an electronic system and a chassis enclosing the electronic system. The chassis has substantially planar upper and lower surfaces and extends from a first end to a second end. The electronic device further comprises an air inlet vent formed in the upper surface proximal to the first end, an exhaust vent formed in the upper surface proximal to the second end, and a flexible air baffle. The flexible air baffle is mounted on the chassis in an arrangement that obstructs air flow between the air inlet vent and the exhaust vent. The flexible air baffle has a thickness that extends across a gap to contact an adjacent surface above the chassis.

According to further embodiments, a system comprises a rack cabinet capable of holding a plurality of stacked electronic devices, an air inlet and exit coupled to mutually opposing sides of the cabinet, a plurality of slots contained within the cabinet and capable of securing the stacked electronic devices, and at least one electronic device inserted into the slots. The individual electronic devices have substantially planar upper and lower surfaces, an air inlet vent formed in the upper surface proximal to the air inlet cabinet side, and an exhaust vent formed in the upper surface proximal to the exit cabinet end. The system further comprises at least one flexible air baffle. The individual baffles are mounted on the upper surface of an associated electronic device in an arrangement that obstructs air flow between the air inlet vent and the exhaust vent. The flexible air baffle has a thickness that extends across a gap to contact an adjacent surface above the upper surface.

BRIEF DESCRIPTION OF THE DRAWINGS

Embodiments of the invention relating to both structure and method of operation, may best be understood by referring to the following description and accompanying drawings.

DETAILED DESCRIPTION

Figure 1A:
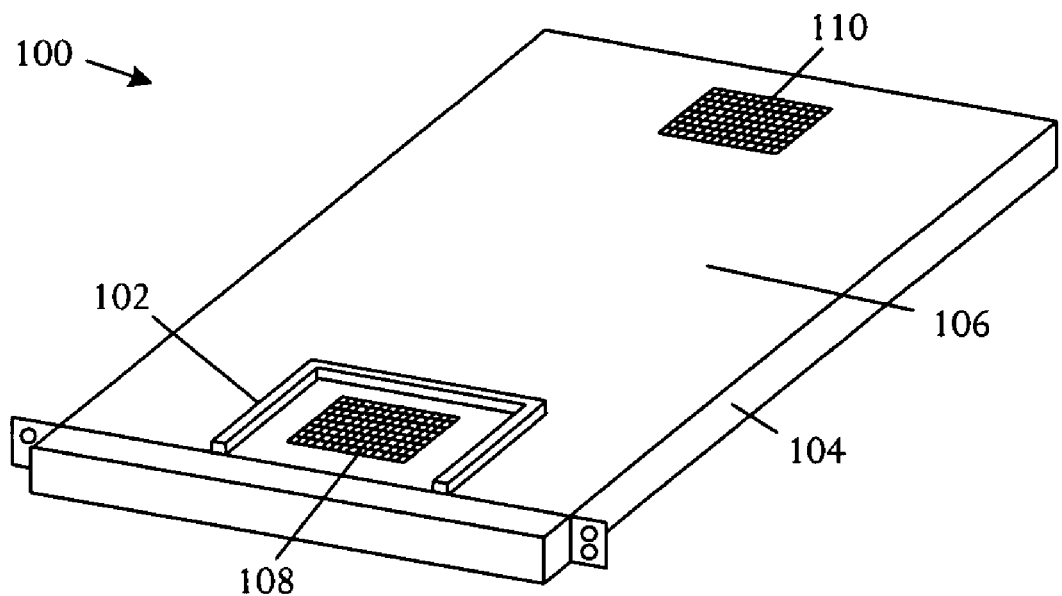
FIGS. 1A, 1B, 1C, 1D, and 1E are multiple perspective pictorial diagrams illustrating embodiments of an airflow management apparatus for usage in an electronic system.

In a system with a fully loaded cabinet or rack, each rack-mounted device in the rack is adjacent to an overlying device or surface. A baffle can be mounted upon the chassis of an electronic device to obstruct air flow in the space between inlet and exhaust vents on the surface of the chassis. The baffle is typically flexible, for example manufactured from materials such as closed-cell foam rubber, and can extend vertically to make contact with the overlying device or other overlying surface. Flexibility of the baffle allows compliance to account for variation, or tolerance, of the gap dimension between devices and surfaces.

The flexible air baffle contacts the underside of the overlying surface, either of an electronic device mounted directly above, or other planar surface, creating an obstruction between the inlet and exhaust vents of the electronic device. The obstruction ensures that air entering the inlet vent is from the front of the rack, preventing re-circulation of hot exhaust air from the exhaust to the inlet.

Referring to FIGS. 1A, 1B, 1C, 1D, and 1E, multiple perspective pictorial diagrams illustrate embodiments of an airflow management apparatus 100 for usage in an electronic system. A flexible air baffle 102 mounts on a chassis 104 of an electronic device 106 in an arrangement that obstructs air flow between an air inlet vent 108 and an air exhaust vent 110 of the electronic device 106.

Figure 1B:
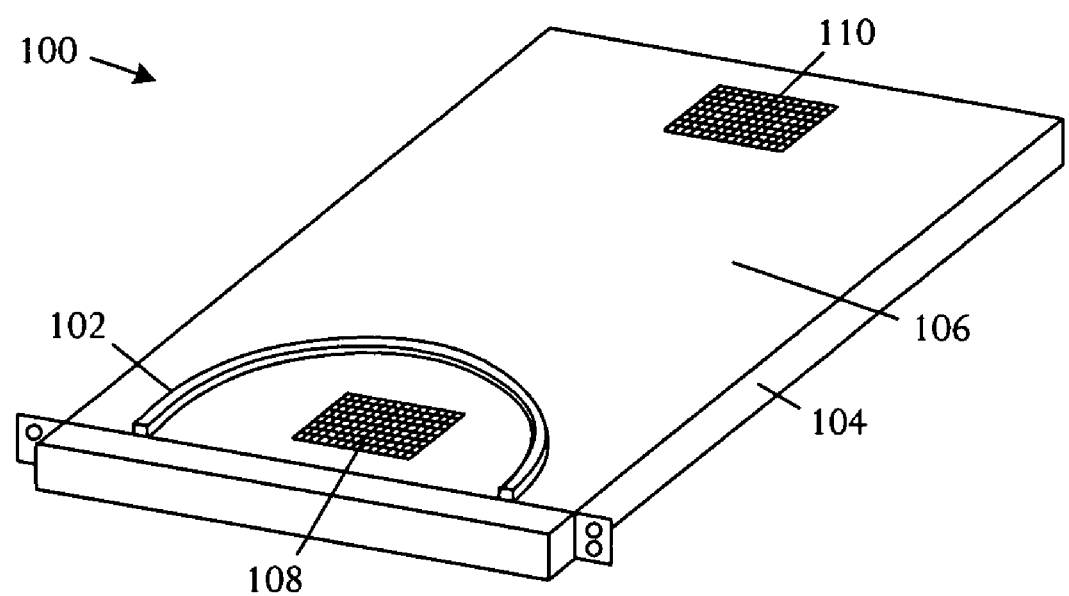
Figure 1C:
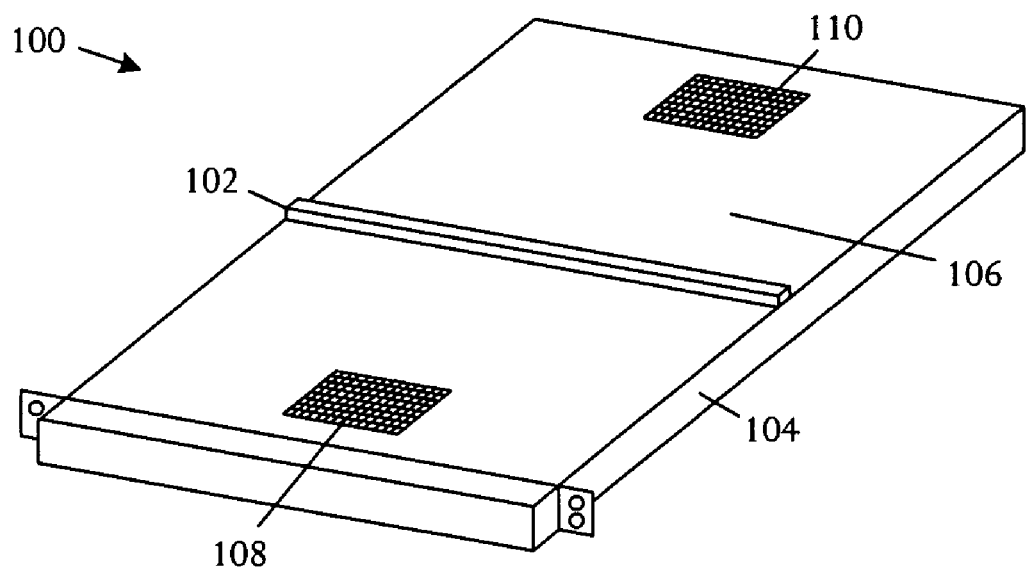
Figure 1D:
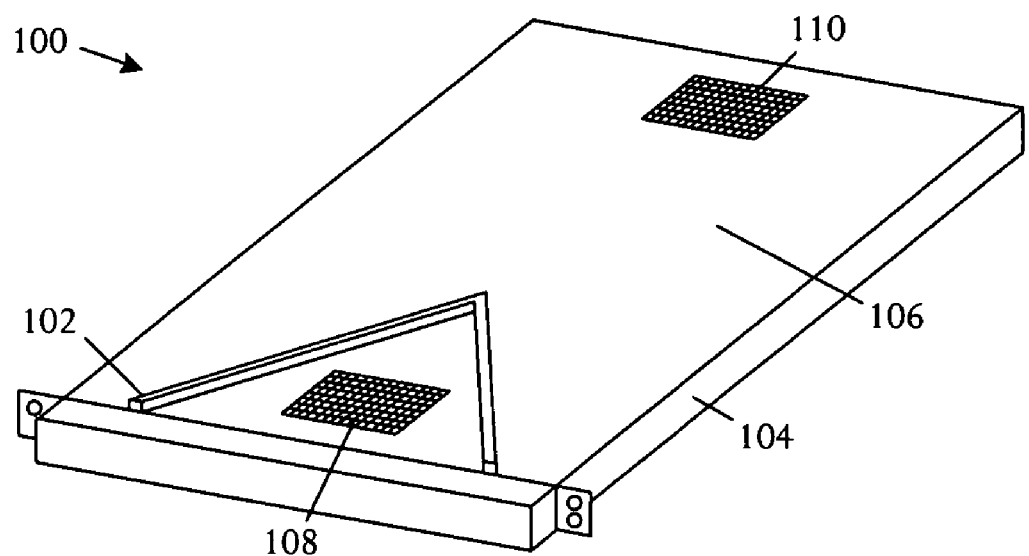
Figure 1E:
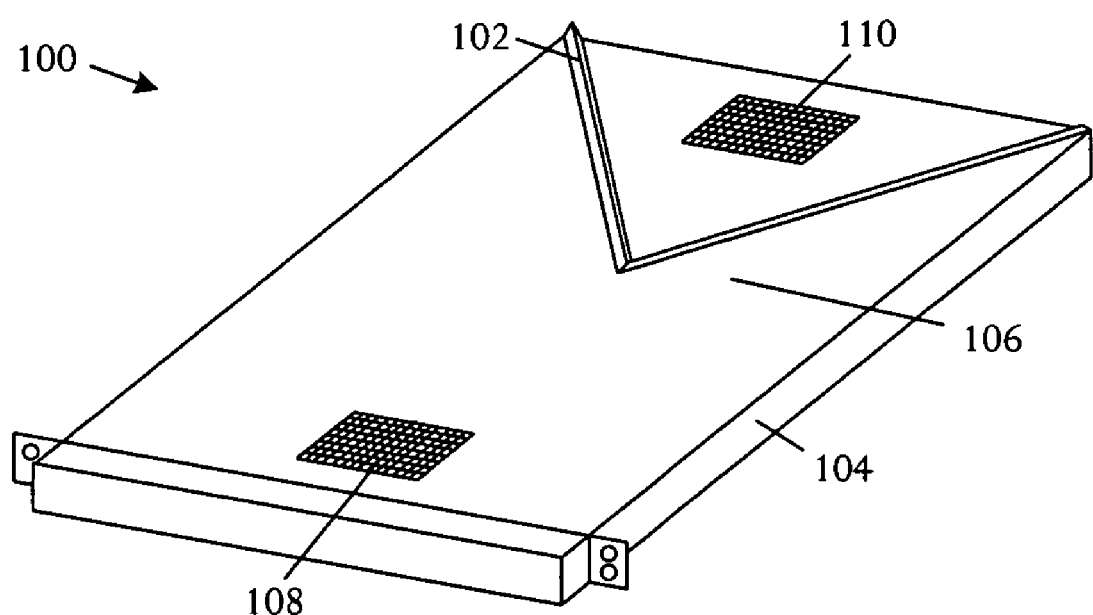
Figure 2:
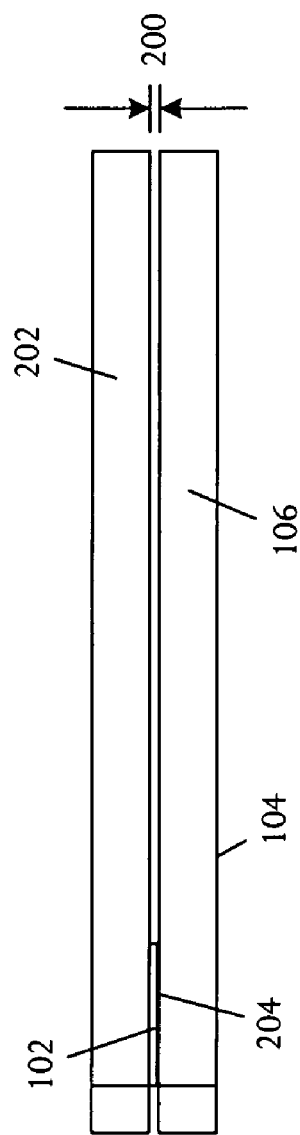
FIG. 2 is a schematic pictorial diagram showing an embodiment of the flexible air baffle.

Referring to FIG. 2 in combination with FIGS. 1A, 1B, 1C, 1D, and 1E, a schematic pictorial diagram shows an embodiment of the flexible air baffle 102 with a thickness that extends across a gap 200 to contact an adjacent vertically-stacked electronic device 202. The flexible air baffle 102 is constructed from a compliant material that allows for variation in the gap dimension between adjacent devices 106 and 202. For example, the flexible air baffle 102 can be constructed from various materials such as closed-cell foam rubber, silicone, reinforced silicone, urethane, urethane foam, polyurethane, foam sealant, butyl rubber, latex, vinyl, compliant metal, reinforced foam, and others. Various rubber products can be used to form the flexible air baffle 102 such as composite, molded, extruded rubbers, neoprene, and the like. In addition to the illustrative shapes, in various embodiments, the flexible air baffle 102 can have different cross-sectional shapes such as a flexible squeegee shape, a thin-walled cross-section, or any other shape that enables compliance with application of a low force.

In some embodiments, the flexible air baffle 102 can be in the form of molded flexible strips that can be applied to the surface of the device chassis 104 in various suitable geometries. For example, FIG. 1A shows an embodiment of an electronic device 106 with the flexible air baffle 102 having the form of a rectangular dam surrounding the air inlet vent 108 on three sides with one side open to receive cooling air. The three closed sides obstruct airflow beyond the air inlet vent 108.

FIG. 1B shows an electronic device embodiment 106 with the flexible air baffle 102 in the form of a semicircle wedge obstructing air flow beyond the air inlet vent 108 and an open side on the diagonal to receive inlet air.

FIG. 1C shows an electronic device 106 with the flexible air baffle 102 in the form of a line dividing front and rear sections of the electronic device 106 in various examples, the flexible air baffle 102 may be positioned at different selected positions relative to the front and rear of the device 106. The illustrative flexible air baffle 102 is straight. In other configurations, the baffle can extend in any shape, irregular, curved, straight, or otherwise so long as the baffle obstructs air flow from the air inlet vent 108 to the air exhaust vent 110.

FIG. 1D shows the flexible air baffle 102 in a V-shaped or triangular form. The illustrative embodiments merely sample the many geometries that are suitable to manage air flow.

FIG. 1E shows an embodiment in which the flexible air baffle 102 forms a dam around the air exhaust vent 110.

The illustrative flexible air baffles 102 each have a frontal aperture coupling to a frontal inlet air supply via an airflow pathway and otherwise extend in a solid wall to obstruct air flow laterally and rearward.

In some embodiments, the flexible air baffle 102 further comprises an adhesive layer 204 that firmly secures the flexible air baffle 102 to the electronic device chassis 104.

Figure 3:
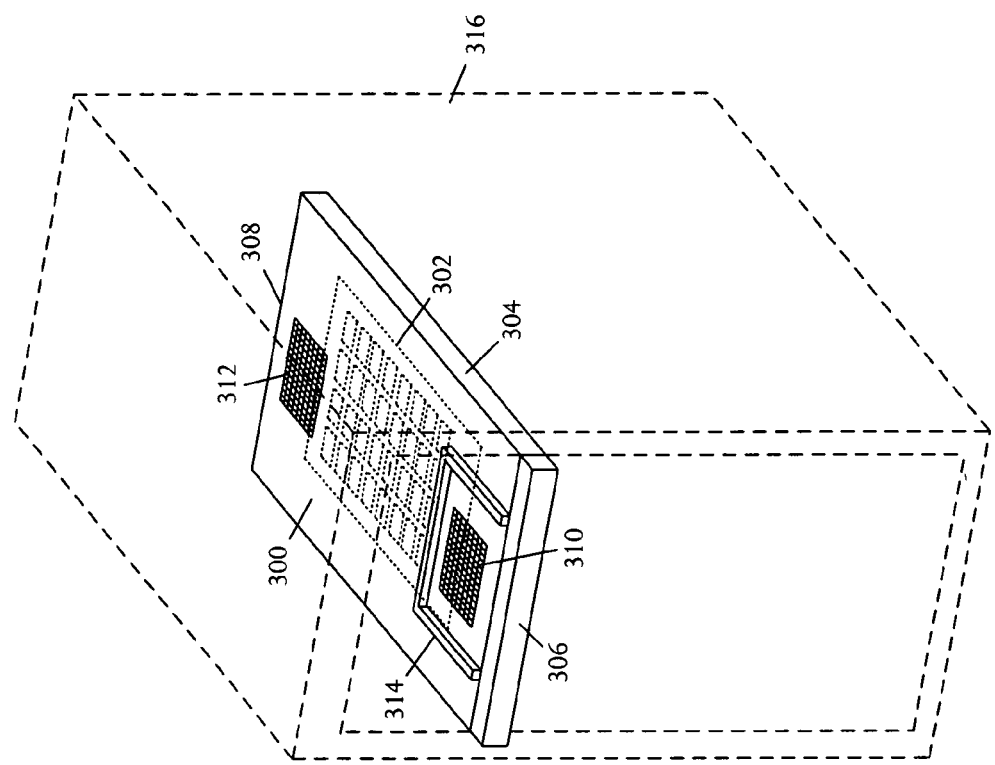
FIG. 3 is a perspective pictorial diagram that illustrates an embodiment of an electronic device including a flexible air baffle for air flow management.

Referring to FIG. 3, a perspective pictorial diagram illustrates an embodiment of an electronic device 300 comprises a chassis 304 and an electronic system 302, shown as dotted lines, enclosed within the chassis 304. The chassis 304 has substantially planar upper and lower surfaces and extends from a first end 306 to a second end 308. The substantially planar surfaces are largely flat and planar, but may have slight variations and imperfections according to common manufacturing and production practices in the industry. The electronic device 300 further comprises an air inlet vent 310 formed in the upper surface proximal to the first end 306, an exhaust vent 312 formed in the upper surface proximal to the second end 308, and a flexible air baffle 314. The flexible air baffle 314 is mounted on the chassis 304 in an arrangement that obstructs air flow between the air inlet vent 310 and the exhaust vent 312.

The electronic device 300 can be used in a rack cabinet 316, illustratively depicted by dashed lines, which can accept a plurality of stacked electronic devices. The cabinet has an air inlet and exit on mutually opposing sides and a plurality of slots capable of securing the stacked electronic devices.

Figure 4:
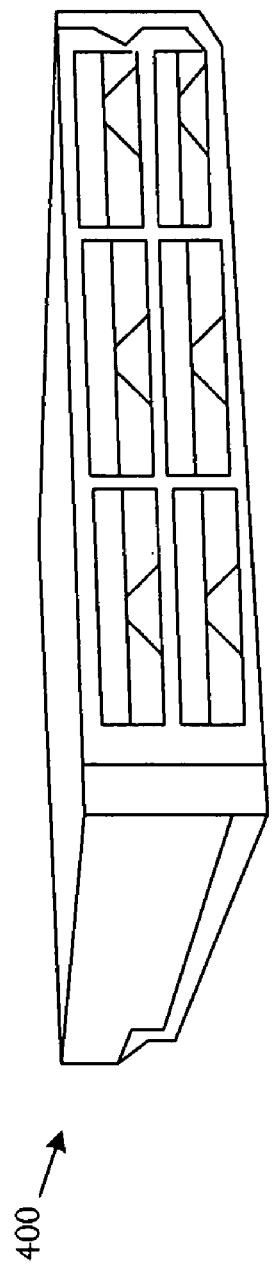
FIG. 4 is a pictorial perspective diagram showing an example of a server that is commonly used in multiple-server deployments.

The electronic device 300 and internal electronic system 302 can be the type of device that performs one or more of various functions. For example the electronic system 302 can be an integrated circuit functioning as a computer or server, signal processor, data processor, storage device, communication device, or the like. For example, FIG. 4 is a pictorial perspective diagram showing an example of a server 400 that is commonly used in multiple-server deployments. In a specific embodiment, the illustrative server 400 can have a 1U size and one-way processor capability for low-cost, rack-optimized usage for single function and front-end applications. Many other types of electronic devices 300 and electronic systems 302 may otherwise or additionally be used.

Figure 5:
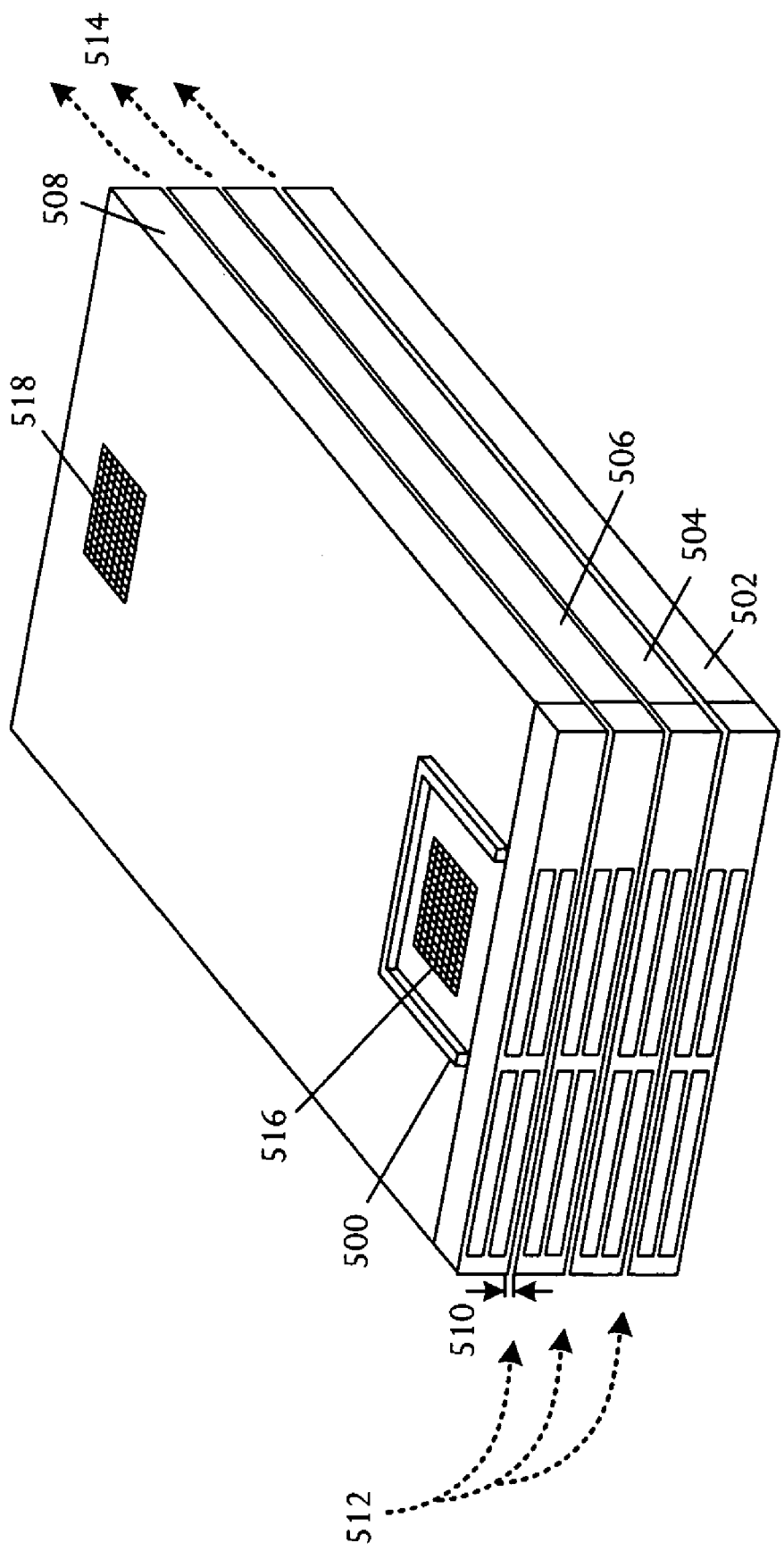
FIG. 5 is a front perspective pictorial diagram illustrating multiple vertically-stacked electronic devices.

Referring to FIG. 5, a front perspective pictorial diagram illustrates multiple vertically-stacked electronic devices, shown as devices 502, 504, 506, and 508, which can be inserted into a rack cabinet. Between each of the devices is a clearance forming an air gap 510. For example, a common air gap distance may be in the range of about 0.05 inches, although smaller or greater separation often occurs. Clearance between adjacent electronic devices leaves the air flow gap 510 that extends from an air inlet 512 to exit 514.

Flexible air baffles 500 can be used to control airflow in an electronic system by encasing multiple electronic devices in a housing having multiple slots for receiving the electronic devices arranged in a stack. The flexible air baffles 500 have a thickness that extends across the gap 510 to contact an adjacent surface above the device chassis. A cooling air stream flow is directed over the plurality of stacked electronic devices from the air inlet 512 to the exit 514. The flexible air baffles 500 obstruct air flow in the clearance gap 510 so that essentially all cooling air passes through the electronic devices.

The flexible air baffles 500 are constructed from a compliant material that allows for variation in the gap dimension between the chassis and the adjacent surface.

In operation, airflow is controlled by providing an electronic device 502, 504, 506, and 508 having substantially planar upper and lower surfaces and extends from a frontal end to a rearward end. The electronic devices have an air inlet vent 516 formed in the upper surface proximal to the frontal end and an exhaust vent 518 formed in the upper surface proximal to the rear end. The electronic device 502, 504, 506, and 508 is inserted a controlled clearance beneath an overlying substantially planar surface, for example the surface formed by an overlying electronic device. The flexible air baffles 500 are flexible structural members that obstruct air flow between the air inlet vent 516 and the exhaust vent 518. The flexible structural member extends vertically to span the gap between the electronic device upper surface and the overlying substantially planar surface.

Figure 6B:
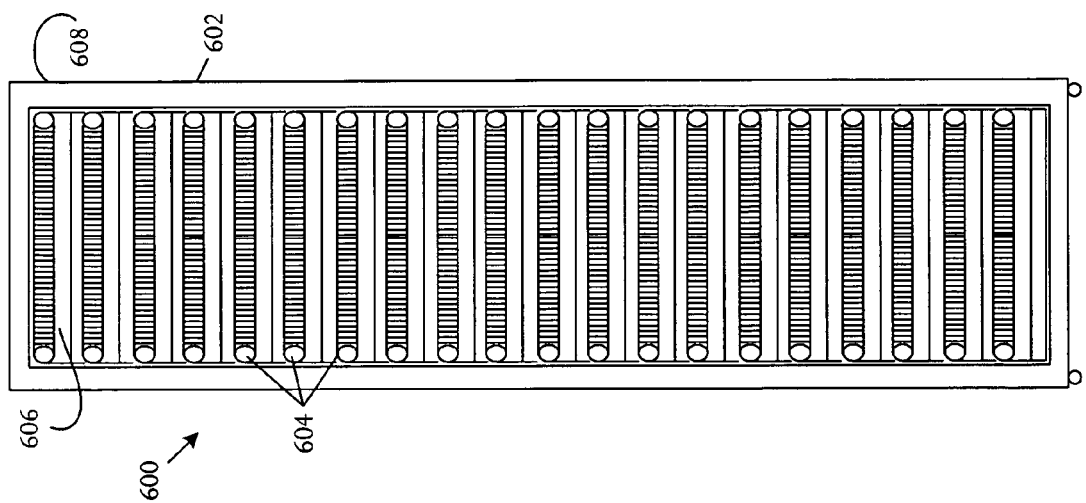
FIGS. 6A and 6B are frontal pictorial views showing different embodiments of systems capable of holding a plurality of stacked electronic devices.
Figure 6A:
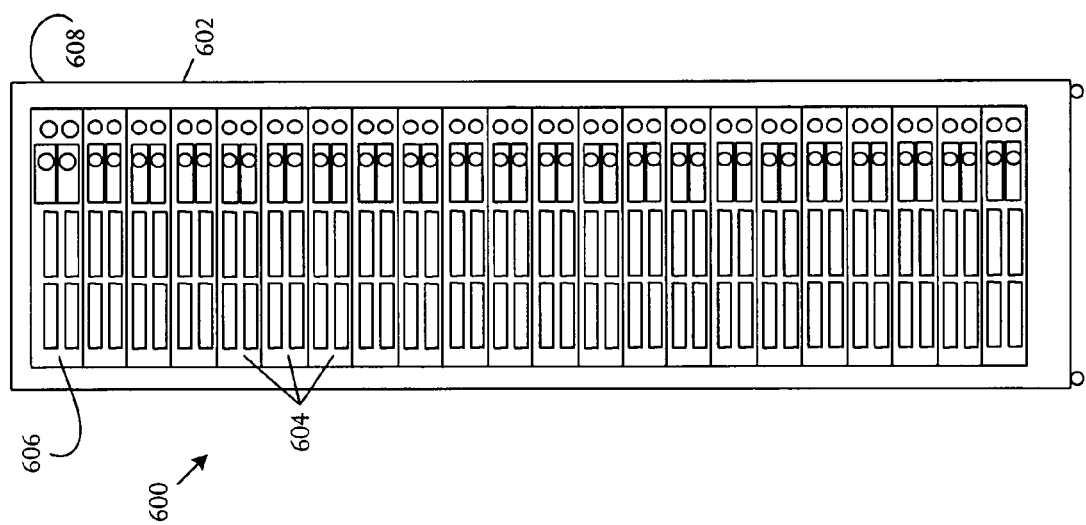

Referring to FIGS. 6A and 6B, two frontal pictorial view show different embodiments of systems 600 comprising a rack cabinet 602 capable of holding a plurality of stacked electronic devices 604, an air inlet 606 and exit 608 coupled to mutually opposing sides of the cabinet 602. A plurality of slots is contained within the cabinet 602 and secures the stacked electronic devices 604. Multiple electronic devices 604 are inserted into the slots. The individual electronic devices 604 have substantially planar upper and lower surfaces, an air inlet vent formed in the upper surface proximal to the air inlet cabinet side, and an exhaust vent formed in the upper surface proximal to the exit cabinet end. The system 600 further comprises flexible air baffles associated with the electronic devices 604. The baffles are mounted on the upper surface of an associated electronic device 604 in an arrangement that obstructs air flow between the air inlet vent and the exhaust vent of the device 604. The flexible air baffle has a thickness that extends across a gap to contact an adjacent surface above the upper surface.

The flexible air baffle mounts on a chassis of an electronic device 604 within the rack 602 that contains the plurality of vertically-stacked electronic devices. Other than the frontal inlet air supply 606 and the rear exhaust vent 608, the rack 602 is substantially closed. The substantially closed character of the rack 602 relates to a structure that is largely closed from the outside, but is not required to be completely air-tight. At the front of the rack 602, the flexible air baffle has an aperture coupling to the inlet air supply 606 via an airflow pathway and otherwise extends in a solid wall to obstruct air flow.

In the illustrative embodiments, the systems 600 are shown containing a plurality of electronic devices 604 filling all of the corresponding slots so that substantially all of the inlet air flow passes through the electronic devices 604 to the exit.

In operation, the electronic devices 604 are enclosed in the rack 602 or other housing having the air inlet 606 and exit 608 on mutually opposing sides with the housing 602 being otherwise substantially closed. The air inlet 606 supplies a cooling airflow stream to the electronic device air inlet vent and the exit 608 vents exhaust air from the electronic device exhaust vents. Direct airflow, not passing through the electronic devices 604, from the air inlet to the exit is substantially otherwise obstructed. Substantial obstruction of direct airflow means that airflow in the system 600 nearly all flows through the electronic devices 604 except for a reasonable, limited amount of leaking through gaps between devices. Some direct airflow can occur from inlet 606 to exit 608 in conditions of a vacant slot.

In some configurations, an electronic device 604 is enclosed in the rack or housing 602 with multiple additional electronic devices 604, obstructing air flow between the air inlet vent 606 and the exhaust vent 608 using a multiple flexible structural members associated with the electronic devices 604. The housing 602 can be fully populated with the electronic devices 604 so that substantially all airflow from the housing air inlet 606 to the exit 608 passes through the electronic devices 604.

Figure 7:
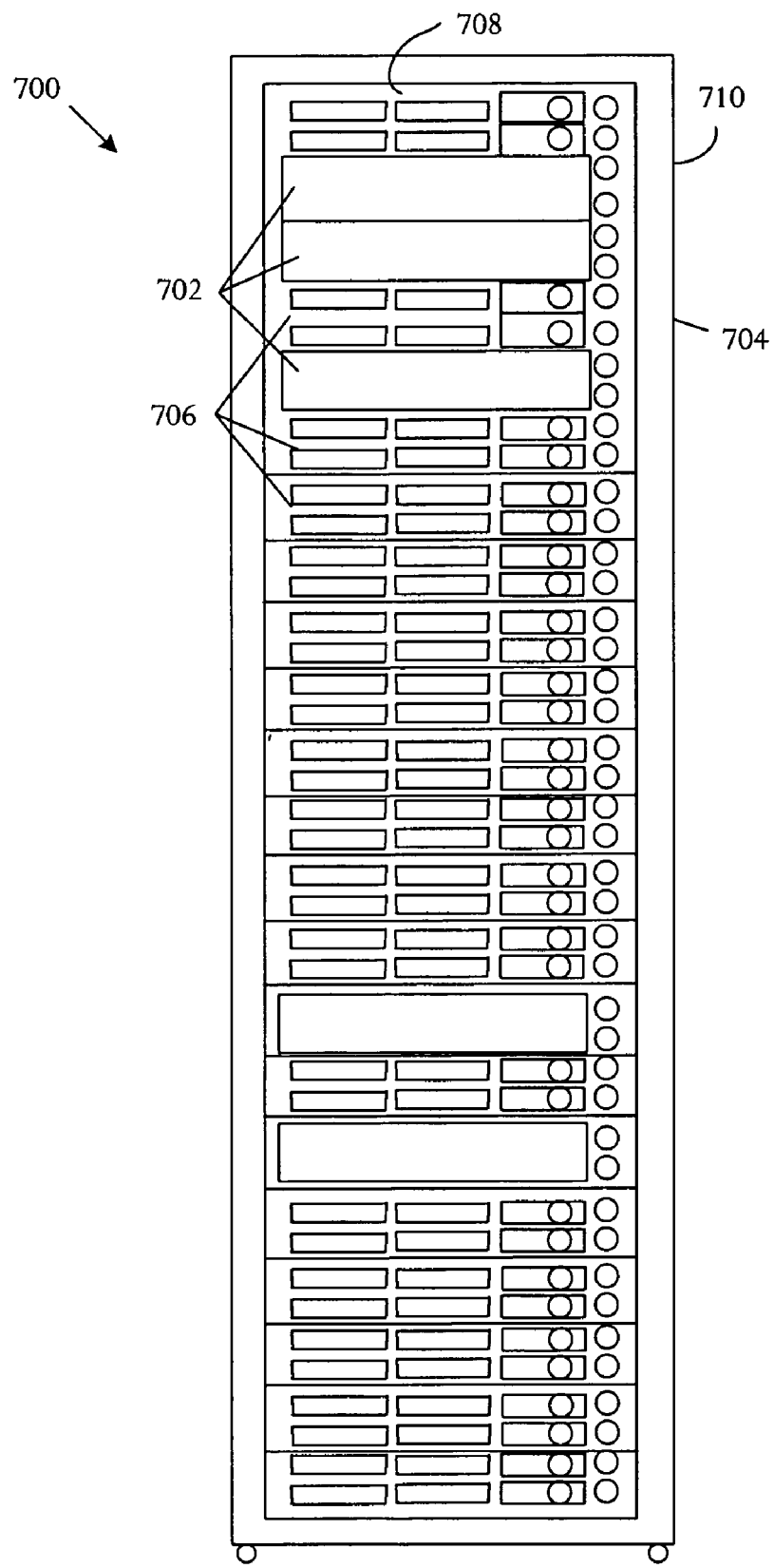
FIG. 7 is a frontal pictorial view showing an embodiment of a system that uses one or more slot fillers to oppose re-circulation.

In other arrangements, configuration, and embodiments, fewer than all of the slots within the rack 602 may be populated by electronic devices 604. Avoidance or elimination of heated exhaust re-circulation from the electronic devices 604 back to the air inlet, and the potential for device over-heating, are desirable. Referring to FIG. 7, a frontal pictorial view shows an embodiment of a system 700 that uses one or more slot fillers 702 to oppose re-circulation. The system 700 has a cabinet or rack 704 with multiple slots. Electronic devices 706 and slot fillers 702 can be inserted into the rack 704 to fill all slots. In the illustrative embodiment, the slot fillers 702 having dimensions that emulate dimensions of an electronic device 706. The electronic devices 706 and slot fillers 702 fill all of the corresponding slots so that substantially all of the air flow from the system cool air inlet 708 passes through the electronic devices 706 and airflow gaps overlying the slot fillers 702 to the exit 710.

Figure 8B:
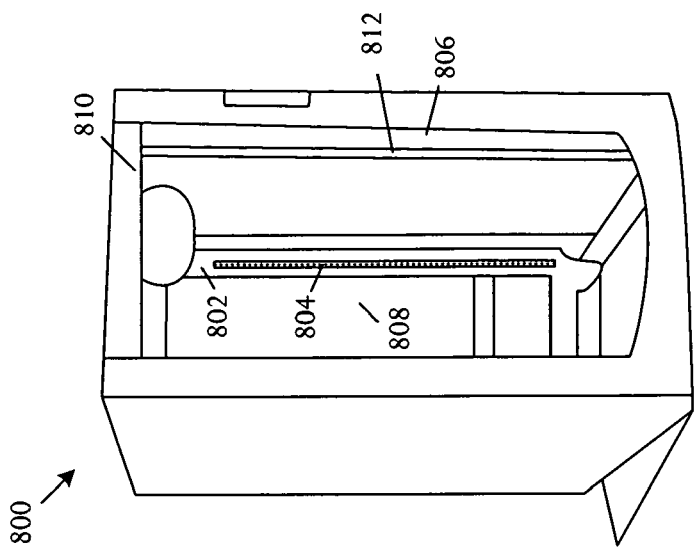
FIGS. 8A and 8B are a pair of perspective pictorial diagrams showing examples of cabinets that can be used in system embodiments using one or more flexible air baffles for air flow management.
Figure 8A:
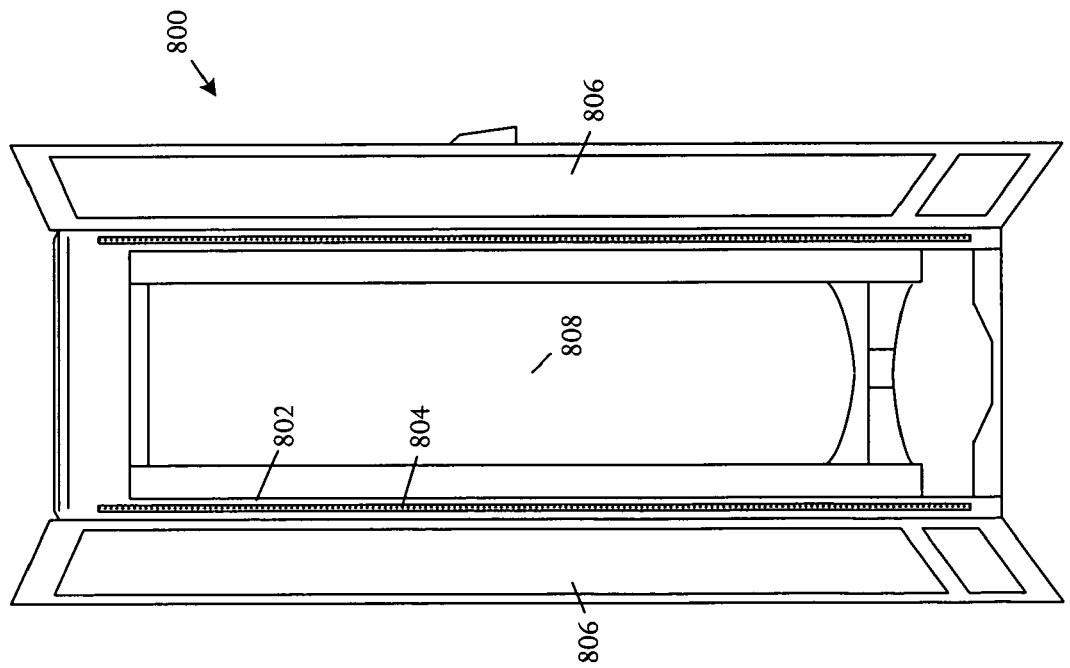

Referring to FIGS. 8A and 8B, a pair of perspective pictorial diagrams show examples of cabinets 800 that can be used in system embodiments using one or more flexible air baffles for air flow management. The illustrative cabinets 800 have a frame 802 and rail 804 design that accepts and supports multiple various electronic devices such as servers, computer systems, storage devices, communication devices, and the like. The frame 802 and rail 804 structure forms a plurality of slots into which the electronic devices can be inserted. The cabinets 800 have fully perforated front 806 and rear 808 doors that supply efficient convection cooling and ventilation, while facilitating visibility. In the embodiments shown in FIGS. 8A and 8B, the air inlet is formed by the perforated front door 806 and the exit formed by the perforated rear door 808.

The cabinet 800 has a frontal surface 810 and columns 812 coupled to the frontal surface on lateral ends of the plurality of slots. The front panel of the electronic devices can attach to the columns 812.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, the specific examples are systems compliant with EIA standards and form factors. The illustrative structures and techniques may be used with systems of any standard and size. Also, the discussion describes contained electronic devices including servers, computer systems, communication equipment, and storage devices. The flexible air baffles can be used in systems using any type of electronic equipment that can be mounted in racks. The disclosed systems, devices, and methods may be used with any suitable electronic devices.

What is claimed is:

1. An airflow management apparatus for usage in an electronic system comprising:
   a flexible air baffle that mounts on a chassis of an electronic device in an arrangement that obstructs air flow between an air inlet vent and an air exhaust vent of the electronic device, the flexible air baffle having a thickness that extends across a gap to contact an adjacent vertically-stacked electronic device.

2. The apparatus according to claim 1 wherein:
   the flexible air baffle is constructed from a compliant material that allows for variation in the gap dimension between adjacent devices.

3. The apparatus according to claim 1 further comprising:
   an adhesive layer that firmly secures the flexible air baffle to the electronic device chassis.

4. The apparatus according to claim 1 wherein:
   the flexible air baffle is constructed from a material selected from among a group comprising closed-cell foam rubber, silicone, reinforced silicone, urethane, urethane foam, polyurethane, foam sealant, butyl rubber, rubber, latex, vinyl, compliant metal, and reinforced foam.

5. The apparatus according to claim 1 wherein:
   the flexible air baffle mounts on a chassis of an electronic device within a rack containing a plurality of vertically-stacked electronic devices;
   the rack has a frontal inlet air supply and a rear exhaust vent, and is otherwise substantially closed; and
   the flexible air baffle has a frontal aperture coupling to the frontal inlet air supply via an airflow pathway and otherwise extends in a solid wall to obstruct air flow laterally and rearward.

6. An electronic device comprising:
   an electronic system;
   a chassis enclosing the electronic system, the chassis having substantially planar upper and lower surfaces and extending from a first end to a second end;
   an air inlet vent formed in the upper surface proximal to the first end;
   an exhaust vent formed in the upper surface proximal to the second end; and
   a flexible air baffle mounted on the chassis in an arrangement that obstructs air flow between the air inlet vent and the exhaust vent, the flexible air baffle having a thickness that extends across a gap to contact an adjacent surface above the chassis.

7. The electronic device according to claim 6 wherein:
   the flexible air baffle is constructed from a compliant material that allows for variation in the gap dimension between the chassis and the adjacent surface.

8. The electronic device according to claim 6 further comprising:
   an adhesive layer that firmly secures the flexible air baffle to the chassis.

9. The electronic device according to claim 6 wherein:
   the flexible air baffle is constructed from a material selected from among a group comprising closed-cell foam rubber, silicone, reinforced silicone, urethane, urethane foam, polyurethane, foam sealant, butyl rubber, rubber, latex, vinyl, compliant metal, and reinforced foam.

10. The electronic device according to claim 6 wherein:
    the chassis can be inserted within a rack containing a plurality of vertically-stacked electronic devices;
    the first end of the chassis is a frontal end and the second end is a rearward end;
    the rack has a frontal inlet air supply and a rear exhaust vent, and is otherwise substantially closed; and
    the flexible air baffle has a frontal aperture coupling to the frontal inlet air supply via an airflow pathway and otherwise extends in a solid wall to obstruct air flow laterally and rearward.

11. A system comprising:
    a rack cabinet capable of holding a plurality of stacked electronic devices;
    an air inlet and exit coupled to mutually opposing sides of the cabinet;
    a plurality of slots contained within the cabinet and capable of securing the stacked electronic devices; and
    at least one electronic device inserted into the slots, the individual electronic devices having substantially planar upper and lower surfaces, and having an air inlet vent formed in the upper surface proximal to the air inlet cabinet side and an exhaust vent formed in the upper surface proximal to the exit cabinet end; and
    at least one flexible air baffle, the individual baffles mounted on the upper surface of an associated electronic device in an arrangement that obstructs air flow between the air inlet vent and the exhaust vent, the flexible air baffle having a thickness that extends across a gap to contact an adjacent surface above the upper surface.

12. The system according to claim 11 wherein:
    the flexible air baffle is constructed from a compliant material that allows for variation in the gap dimension between the chassis and the adjacent surface.

13. The system according to claim 11 further comprising:
    an adhesive layer that firmly secures the flexible air baffle to the electronic device upper surface.

14. The system according to claim 11 wherein:
    the flexible air baffle is constructed from a material selected from among a group comprising closed-cell foam rubber, silicone, reinforced silicone, urethane, urethane foam, polyurethane, foam sealant, rubber, butyl rubber, latex, vinyl, compliant metal, and reinforced foam.

15. The system according to claim 11 wherein:
    the flexible air baffle has an aperture coupling to an inlet air supply via an airflow pathway and otherwise extends in a solid wall to obstruct air flow.

16. The system according to claim 11 further comprising:
    a plurality of electronic devices filling all of the corresponding slots so that substantially all of the inlet air flow passes through the electronic devices to the exit.

17. The system according to claim 11 further comprising:
    at least one electronic device; and
    at least one slot filler, the slot fillers having dimensions that emulate dimensions of an electronic device;
    the electronic devices and slot fillers filling all of the corresponding slots so that substantially all of the inlet air flow passes through the electronic devices and airflow gaps overlying the slot fillers to the exit.

18. A method of controlling airflow in an electronic system comprising:
    providing an electronic device having substantially planar upper and lower surfaces and extending from a first end to a second end, an air inlet vent formed in the upper surface proximal to the first end, and an exhaust vent formed in the upper surface proximal to the second end;
    inserting the electronic device a controlled clearance beneath an overlying substantially planar surface; and
    obstructing air flow between the air inlet vent and the exhaust vent using a flexible structural member that extends the controlled clearance from the electronic device upper surface to the overlying substantially planar surface.

19. The method according to claim 18 further comprising:
enclosing the electronic device in a housing having an air inlet and exit on mutually opposing sides, the housing being otherwise substantially closed;
supplying a cooling airflow stream from the housing air inlet to the electronic device air inlet vent; and
venting exhaust from the electronic device exhaust vent to the housing exit, direct airflow from the housing air inlet to the exit being substantially otherwise obstructed.

20. The method according to claim 19 further comprising:
enclosing the electronic device in the housing with a plurality of additional electronic devices having obstructed air flow between the air inlet vent and the exhaust vent using a plurality of flexible structural members, the housing being fully populated with the electronic devices so that substantially all airflow from the housing air inlet to the exit passes through the electronic devices.

21. The method according to claim 19 further comprising:
enclosing the electronic device in the housing with at least one slot fillers having dimensions that emulate dimensions of an electronic device and/or at least one additional electronic devices, the housing being fully populated with slot fillers and electronic devices so that substantially all airflow passes through the electronic devices and airflow gaps overlying the slot fillers to the exit.

22. A system for controlling airflow in an electronic system comprising:
means for encasing a plurality of electronic devices, the electronic devices having substantially planar upper and lower surfaces and having an air inlet vent formed in the upper surface proximal to the air inlet cabinet side and an exhaust vent formed in the upper surface proximal to the exit cabinet end;
means within the encasing means for receiving the plurality of electronic devices arranged in a stack;
means for directing a cooling air stream flow over the plurality of stacked electronic devices from an air inlet to an exit; and
means for obstructing air flow between the electronic devices' air inlet vent and the exhaust vent so that substantially all airflow from the housing air inlet to the exit passes through the electronic devices.

* * * * *